(12) United States Patent
Chou et al.

(10) Patent No.: US 12,389,535 B2
(45) Date of Patent: Aug. 12, 2025

(54) THREE-DIMENSIONAL CIRCUIT BOARD, MANUFACTURING METHOD THEREOF, AND PROBE CARD

(71) Applicant: Industrial Technology Research Institute, Hsinchu (TW)

(72) Inventors: Min-Chieh Chou, Taipei (TW); Meng-Chi Huang, Taoyuan (TW); Tune-Hune Kao, Hsinchu (TW); Yue-Zhen Huang, Yilan County (TW)

(73) Assignee: Industrial Technology Research Institute, Hsinchu (TW)

( * ) Notice: Subject to any disclaimer, the term of this patent is extended or adjusted under 35 U.S.C. 154(b) by 336 days.

(21) Appl. No.: 18/073,561

(22) Filed: Dec. 2, 2022

(65) Prior Publication Data
US 2023/0209706 A1 Jun. 29, 2023

(30) Foreign Application Priority Data
Dec. 28, 2021 (TW) .................. 110149042

(51) Int. Cl.
*H05K 1/02* (2006.01)
*G01R 1/073* (2006.01)
*H05K 1/03* (2006.01)

(52) U.S. Cl.
CPC ....... *H05K 1/0284* (2013.01); *G01R 1/07342* (2013.01); *H05K 1/0306* (2013.01)

(58) Field of Classification Search
CPC .. H05K 1/0284; H05K 1/0306; H05K 3/0029; H05K 1/14; H05K 1/183;
(Continued)

(56) References Cited

U.S. PATENT DOCUMENTS

| 9,459,286 B2 | 10/2016 | Lee et al. |
| 11,067,600 B2 | 7/2021 | Takemura et al. |

(Continued)

FOREIGN PATENT DOCUMENTS

| CN | 111315709 | 6/2020 |
| JP | 6142457 | 6/2017 |

(Continued)

OTHER PUBLICATIONS

Jinwook Song et al., "Probe Card Design with Signal and Power Integrity for Wafer-Level Application Processor Test in LPDDR Channel," 2016 IEEE 66th Electronic Components and Technology Conference, May 2016, pp. 2442-2448.

(Continued)

*Primary Examiner* — Timothy J Thompson
*Assistant Examiner* — Paramita Ghosh
(74) *Attorney, Agent, or Firm* — JCIPRNET

(57) ABSTRACT

A three-dimensional circuit board, including a ceramic substrate and multiple circuits, is provided. The ceramic substrate has a first plane, a second plane, a third plane located between the first plane and the second plane, a first side surface connecting the first plane and the second plane, and a second side surface connecting the first plane and the third plane and opposite to the first side surface. A first height of the first side surface is greater than a second height of the second side surface. The circuits are separately embedded on the first plane of the ceramic substrate and extend along the first side surface to be embedded on the second plane.

14 Claims, 5 Drawing Sheets

(58) Field of Classification Search
CPC ............... H05K 3/368; G01R 1/07342; G01R 1/07378; G01R 3/00
See application file for complete search history.

(56) References Cited

U.S. PATENT DOCUMENTS

| | | | |
|---|---|---|---|
| 2002/0008530 | A1 | 1/2002 | Kim et al. |
| 2007/0259456 | A1* | 11/2007 | Gritters ............... G01R 3/00 438/14 |
| 2012/0162928 | A1* | 6/2012 | Das ............... H01L 23/49833 361/728 |
| 2015/0028912 | A1 | 1/2015 | Cho et al. |
| 2015/0054541 | A1 | 2/2015 | Lee et al. |
| 2015/0109016 | A1 | 4/2015 | Lou et al. |
| 2020/0379006 | A1 | 12/2020 | Turchin et al. |
| 2021/0102974 | A1 | 4/2021 | Park et al. |

FOREIGN PATENT DOCUMENTS

| | | | |
|---|---|---|---|
| TW | 200841020 | | 10/2008 |
| TW | 201332407 A | * | 8/2013 |
| TW | I413775 | | 11/2013 |
| TW | I442847 | | 6/2014 |
| TW | I506282 | | 11/2015 |
| TW | I648541 | | 1/2019 |
| TW | I730708 | | 6/2021 |

OTHER PUBLICATIONS

Jianhui Liu et al., "The design of multilayer IC test board based on ATE," 2017 18th International Conference on Electronic Packaging Technology, Aug. 2017, pp. 1552-1556.

Hitoshi Iwai et al., "Cantilever type probe card for at-speed memory test on wafer," 23rd IEEE VLSI Test Symposium (VTS'05), May 2005, pp. 1-5.

Jae-Hwan Lim et al., "Highly Productive Process Technologies of Cantilever-type Microprobe Arrays for Wafer Level Chip Testing," Transactions on Electrical and Electronic Materials, vol. 14, Apr. 2013, pp. 63-66.

Mutsuo Daito et al., "Capacitively Coupled Non-Contact Probing Circuits for Membrane-Based Wafer-Level Simultaneous Testing," IEEE Journal of Solid-State Circuits, vol. 46, Oct. 2011, pp. 2386-2395.

"Office Action of Taiwan Counterpart Application", issued on Nov. 4, 2022, p. 1-p. 6.

* cited by examiner

THREE-DIMENSIONAL CIRCUIT BOARD, MANUFACTURING METHOD THEREOF, AND PROBE CARD

CROSS-REFERENCE TO RELATED APPLICATION

This application claims the priority benefit of Taiwan application serial no. 110149042, filed on Dec. 28, 2021. The entirety of the above-mentioned patent application is hereby incorporated by reference herein and made a part of this specification.

BACKGROUND

Technical Field

The disclosure relates to a circuit board and a manufacturing method thereof, and more particularly to a three-dimensional circuit board, a manufacturing method thereof, and a probe card using the three-dimensional circuit board.

Description of Related Art

Most circuit boards of traditional probe cards use multi-layer printed circuit boards or multi-layer ceramic capacitors (MLCC) exclusively provided by Kyocera. The multi-layer printed circuit boards usually use polymer materials (for example, epoxy resin), which have a large thermal expansion coefficient and are not easy to apply to the thermal shock resistance test environment of automotive chips and high-density probe cards. The multi-layer ceramic capacitors have the following technical bottlenecks. 1) High temperature sintering is performed using silver paste screen printing technology and metal paste to manufacture a metal circuit on a ceramic substrate. However, the high temperature sintering may cause deviations of the circuit size and the position of the metal circuit, such as about 5% to 14% positional precision error, which will cause the offset of upper and lower circuit conduction of the multi-layer ceramic circuit stack co-sintering in the future, thereby causing the precision of the line width and the line spacing to be uncontrollable. In addition, during the manufacturing process, the silver paste through hole filling process must increase the hole pitch to prevent short circuit caused by the overflow of silver paste, which reduces the internal interconnection density. 2) The circuit element size and the line width are getting smaller and smaller, but the minimum line width of silver paste screen printing for high temperature thick film (with metal film thickness of greater than 10 μm) can only reach more than 50 μm, which does not meet the future requirements of the high-frequency and high-density probe card industry with the line width being less than 30 μm. 3) Metal paste sintering technology must use high temperature sintering at a temperature of 800° C. to 900° C. and with a process time of more than 1 hour in order to remove polymers such as silver paste or copper paste to have good metal conductivity. However, using high temperature and long time sintering is an energy-intensive industry, and metal flatness is easily affected by paste uniformity. 4) Due to the limitation that screen printing can only print a circuit on a plane, the conventional multi-layer ceramic capacitors can only be in the form of two-dimensional planar circuit boards. 5) Every time a wafer to be tested is replaced, the required probe card, the multi-layer ceramic capacitor thereof, and the screen and fixture required for manufacturing must be redesigned and manufactured. However, the probe card is a small-quantity large-variety product, and the number of each design is only a dozen, so the apportioned cost of the high-precision multi-layer ceramic capacitor used for the probe card is quite high.

SUMMARY

The disclosure provides a probe card including the three-dimensional circuit board, which can effectively prevent a probe from colliding with the three-dimensional circuit board or a printed circuit board during a test process to have good test stability.

The three-dimensional circuit board of the disclosure includes a ceramic substrate and multiple circuits. The ceramic substrate has a first plane, a second plane, a third plane located between the first plane and the second plane, a first side surface connecting the first plane and the second plane, and a second side surface connecting the first plane and the third plane and opposite to the first side surface. A first height of the first side surface is greater than a second height of the second side surface, and the third plane and the second side surface form a groove. The circuits are separately embedded on the first plane of the ceramic substrate and extend along the first side surface to be embedded on the second plane. In addition, an arrangement density of the circuits on the first plane is greater than an arrangement density on the second plane.

The manufacturing method of the three-dimensional circuit board of the disclosure includes the following steps. A ceramic substrate is provided. The ceramic substrate has a first plane, a second plane, a third plane located between the first plane and the second plane, a first side surface connecting the first plane and the second plane, and a second side surface connecting the first plane and the third plane and opposite to the first side surface. A first height of the first side surface is greater than a second height of the second side surface, and the third plane and the second side surface form a groove. A laser process is performed to form multiple trenches separated from each other on the ceramic substrate. The trenches extend from the first plane of the ceramic substrate onto the second plane along the first side surface, and there is a trace metal in each trench. An electroplating process is performed with the trace metal as an electroplating seed layer to electroplate to form multiple circuits embedded on the first plane, the first side surface, and the second plane.

The probe card of the disclosure includes the three-dimensional circuit board, a printed circuit board, and a probe structure. The printed circuit board is disposed on the second plane of the three-dimensional circuit board and is electrically connected to the circuits. The probe structure includes a cantilever and a needle. The cantilever has a fixed end and a free end. The fixed end is disposed on the first plane and connects the circuits. The needle is connected to the free end, and there is an air gap between the cantilever and the third plane.

In order for the features and advantages of the disclosure to be more comprehensible, the following specific embodiments are described in detail in conjunction with the drawings.

DETAILED DESCRIPTION OF DISCLOSED EMBODIMENTS

The disclosure provides a three-dimensional circuit board and a manufacturing method thereof, which have the advantages of simple manufacturing and low cost, and circuits are separated from each other without interlacing to effectively prevent cross talk.

Figure 1A:
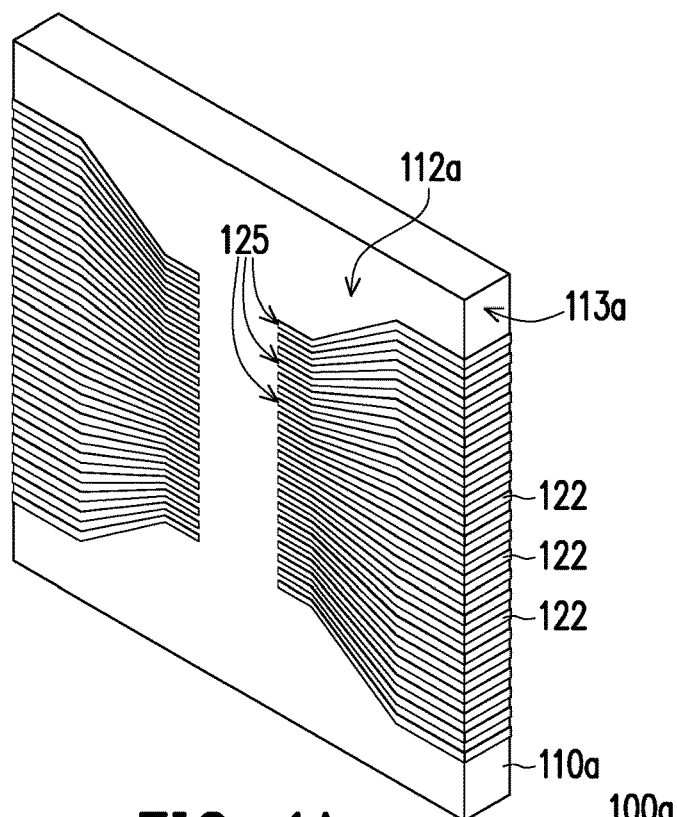
FIG. 1A is a schematic perspective view of a three-dimensional circuit board according to an embodiment of the disclosure.
Figure 1B:
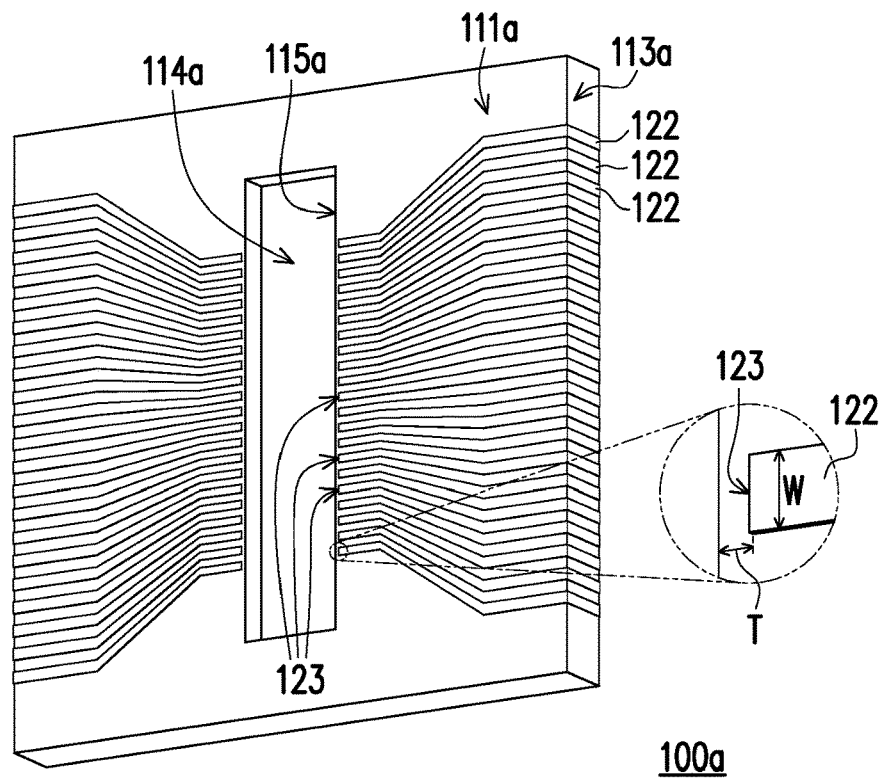
FIG. 1B is a schematic perspective view of the three-dimensional circuit board of FIG. 1A from another viewing angle.
Figure 1C:
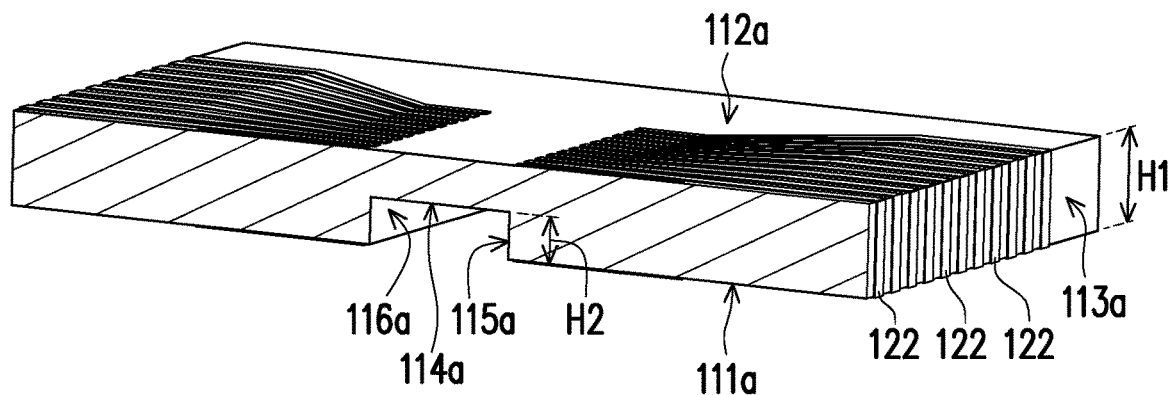
FIG. 1C is a schematic perspective cross-sectional view of the three-dimensional circuit board of FIG. 1A.

FIG. 1A is a schematic perspective view of a three-dimensional circuit board according to an embodiment of the disclosure. FIG. 1B is a schematic perspective view of the three-dimensional circuit board of FIG. 1A from another viewing angle. FIG. 1C is a schematic perspective cross-sectional view of the three-dimensional circuit board of FIG. 1A. Please refer to FIG. 1A, FIG. 1B, and FIG. 1C at the same time. In the embodiment, a three-dimensional circuit board 100a includes a ceramic substrate 110a and multiple circuits 122. The ceramic substrate 110a has a first plane 111a, a second plane 112a, a third plane 114a between the first plane 111a and the second plane 112a, a first side surface 113a connecting the first plane 111a and the second plane 112a, and a second side surface 115a connecting the first plane 111a and the third plane 114a and opposite to the first side surface 113a. A first height H1 of the first side surface 113a is greater than a second height H2 of the second side surface 115a. In an embodiment, the second height H2 is at least greater than 150 µm. The circuits 122 are separately embedded on the first plane 111a of the ceramic substrate 110a and extend along the first side surface 113a to be embedded on the second plane 112a.

Furthermore, the ceramic substrate 110a of the embodiment has a groove 116a, wherein a bottom surface of the groove 116a is the third plane 114a, and a sidewall of the groove 116a is the second side surface 115a. In other words, the groove 116a does not penetrate the ceramic substrate 110a, and the third plane 114a and the second side surface 115a form the groove 116a. The material of the ceramic substrate 110a is, for example, metal oxide, metal nitride, silicon nitride, silicon carbide, or a combination of the above materials, wherein the metal oxide is, for example, alumina or zirconia, and the metal nitride is, for example, aluminum nitride. The combination is, for example, an alumina material containing about 5% zirconia, but not limited thereto. In an embodiment, the ceramic substrate 110a includes 0.1 wt % to 5 wt % of yttrium element.

Furthermore, the circuit 122 of the embodiment has a first end 123 and a second end 125. The first end 123 of the circuit 122 is located on the first plane 111a, and the second end 125 of the circuit 122 is located on the second plane 112a, wherein the second end 125 of the circuit 122 is adapted to contact an external element. In an embodiment, there is a horizontal distance T between the first end 123 of the circuit 122 and the second side surface 115a of the ceramic substrate 110a, and the horizontal distance T is equal to 0 or less than 100 µm. In the embodiment, the first end 123 of the circuit 1122 spreads in a fan shape from the first plane 111a or extends in parallel onto the first side surface 113a and the second plane 112a, and the second end 125 of the circuit 122 is adapted to contact an external element to form electrical conduction. In an embodiment, an arrangement density of the circuits 122 on the first plane 111a may be greater than an arrangement density on the second plane 112a, so the three-dimensional circuit board 100a may be regarded as a space transformer. In addition, a line width W of the circuit 122 of the embodiment is, for example, between 10 µm and 65 µm.

The conventional sintered multi-layer ceramic circuit board runs in each circuit layer due to the extended circuit, so the space between circuits is inevitably interlaced, thereby causing signal interference. However, in the embodiment, since the circuits 122 on the ceramic substrate 110a are separated from each other and are not spatially interlaced, signal interference between the circuits 122 can be greatly reduced. Therefore, the three-dimensional circuit board 100a of the embodiment can effectively prevent cross talk.

Figure 2A:
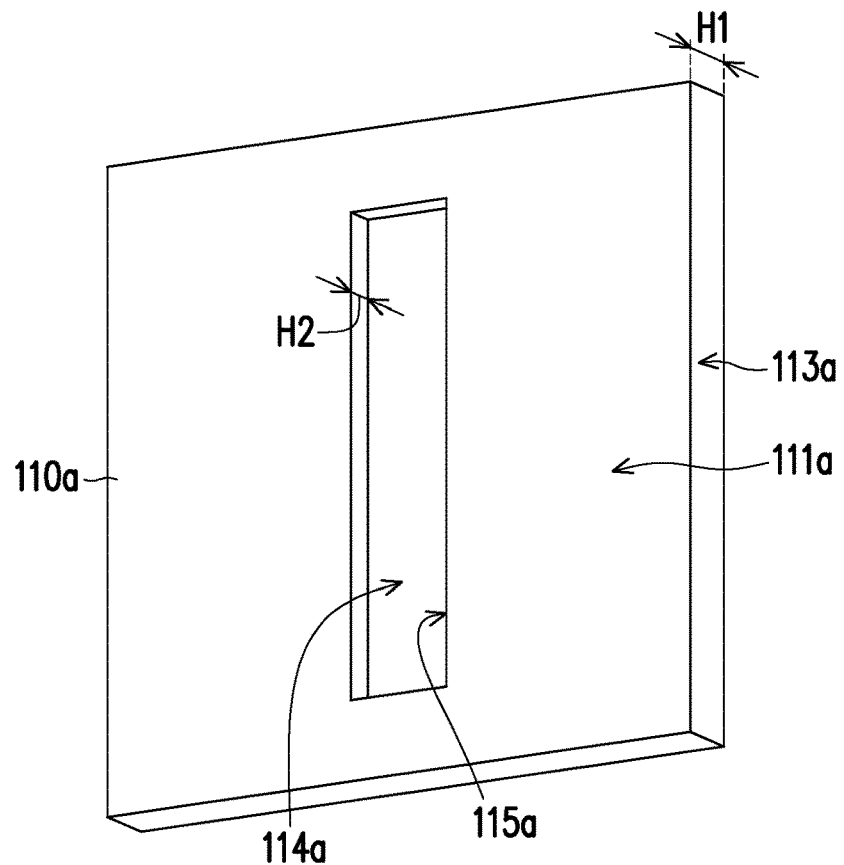
FIG. 2A to FIG. 2C are schematic perspective views of a manufacturing method of a three-dimensional circuit board according to an embodiment of the disclosure.
Figure 2B:
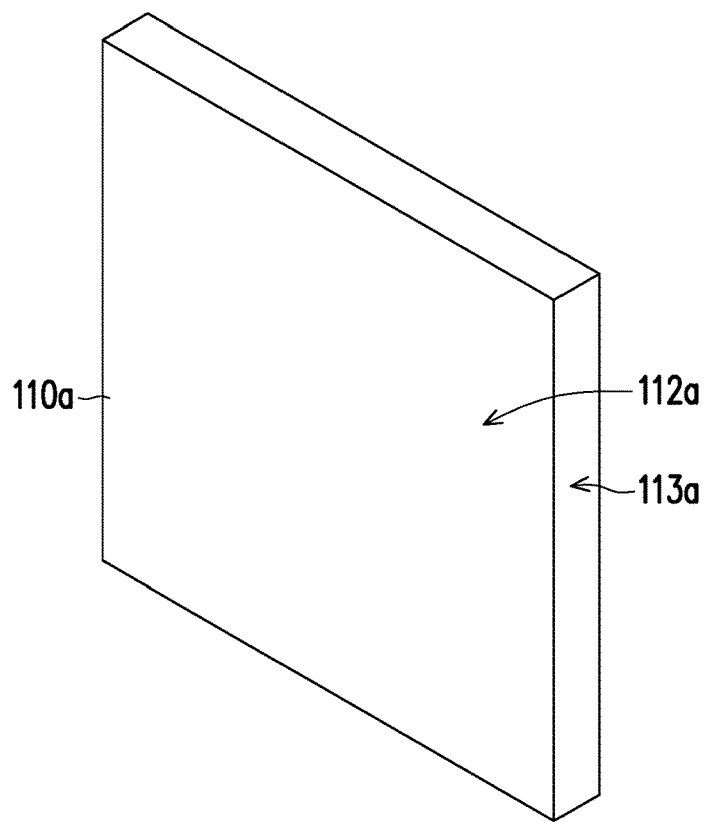

In addition, for the process of the three-dimensional circuit board 100a, please refer to FIG. 2A and FIG. 2B at the same time. First, the ceramic substrate 110a is provided. The ceramic substrate 110a has the first plane 111a, the second plane 112a, the third plane 114a located between the first plane 111a and the second plane 112a, the first side surface 113a connecting the first plane 111a and the second plane 112a, and the second side surface 115a connecting the first plane 111a and the third plane 114a and opposite to the first side surface 113a. The first height H1 of the first side surface 113a is greater than the second height H2 of the second side surface 115a. More specifically, the ceramic substrate 110a has the groove 116a, wherein the bottom surface of the groove 116a is the third plane 114a, and the sidewall of the groove 116a is the second side surface 115a. In other words, the third plane 114a and the second side surface 115a form the groove 116a.

Figure 2C:
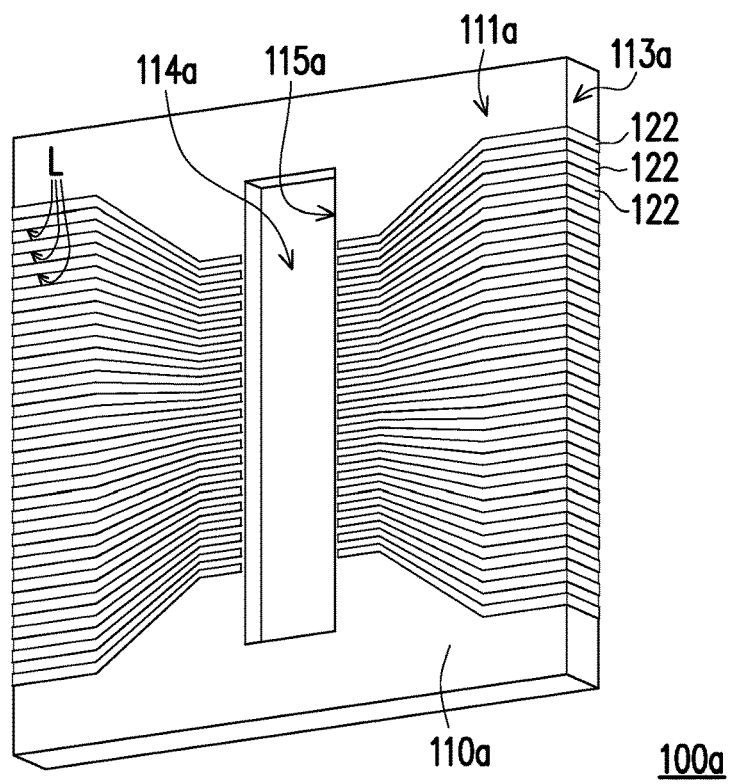

Next, please refer to FIG. 2C. A CAD drawing of the three-dimensional circuit board is imported into a three-dimensional laser system and is aligned and overlapped with the three-dimensional ceramic substrate 110a after precision machining. Next, a laser process is performed to form multiple trenches L separated from each other on the ceramic substrate 110a, wherein the trenches L extend from the first plane 111a of the ceramic substrate 110a onto the second plane 112a along the first side surface 113a, and there is a trace metal in each trench L. More specifically, performing the laser process includes irradiating green laser light onto the ceramic substrate 110a, wherein the wavelength of the green laser light is, for example, 532 nm, and the spot size of the laser beam is, for example, 10 µm. The green laser light is directly irradiated onto the surface of the ceramic substrate 110a to perform circuit pattern definition and material excitation processing, which can effectively save the manufacturing cost of using a screen or a photomask in the prior art. In addition, since the ceramic substrate 110a of the embodiment contains the trace metal, such as 0.1 wt % to 5 wt % of yttrium element, which exists in the ceramic substrate 110a in the state of metal element or oxide, the yttrium element is exposed after the ceramic substrate 110a is subjected to laser patterning.

Finally, please refer to FIG. 2C again. An electroplating process is performed to electroplate the trenches L with the trace metal as an electroplating seed layer, so as to form the circuits 122 embedded on the first plane 111a, the first side surface 113a, and the second plane 112a. In other words, in the embodiment, surface treatment technology and metallization technology may be combined to deposit metal on a circuit region after laser patterning, so as to form the circuits 122. Here, the electroplating process is, for example, electroless copper plating, so that copper metal is deposited in the trenches L of the ceramic substrate 110a to form a metal microstructure, and electroless silver metal is then further deposited to protect the copper structure, so as to form the circuits 122 separated from each other.

Since the ceramic laser metallization technology is a low temperature fast process, and the laser light may be used to precisely control the position and the line width of the circuit 122, the minimum line width W of the circuit 122 may be less than 65 μm, and the positional precision may be controlled below±10 μm, which can meet the future developmental requirements of wafer element size miniaturization and high-frequency modules, and have high energy-saving benefits. Here, the metals used are copper and silver, which have low skin effect loss. Using the above manner can achieve technical advantages such as fast signal transmission speed, high positional precision of the circuit 122, simplified manufacturing process, and low cost.

In short, the manufacturing manner of the three-dimensional circuit board 100a of the embodiment combines laser patterning and high-selectivity metallization technology to manufacture the precise three-dimensional metal circuit 122 on the surface of the ceramic substrate 110a, so as to form the three-dimensional circuit board 100a. Therefore, the process of the embodiment does not need to use a photomask. The process can be more flexible and quickly manufactured, can shorten the developmental time, is suitable for small-quantity large-variety production, and has low cost of process tools, so that the overall manufacturing cost of the three-dimensional circuit board 100a of the embodiment is low. In other words, the manufacturing method of the three-dimensional circuit board 100a of the embodiment is a low temperature process, which enables the positional precision of the circuits 122 to be high and has advantages such as simple process, high yield, and low cost. Furthermore, since the circuits 122 formed in the embodiment are not interlaced, signal cross talk can be effectively reduced. In addition, compared with the prior art in which high-precision fine circuits cannot be manufactured due to thermal expansion and contraction, in the embodiment, three-dimensional circuit wiring may be directly performed on the appearance of the ceramic substrate 110a through laser-induced metallization, and the high-precision fine circuits 122 can be manufactured, which can meet the requirement (of the pitch between the circuits being less than or equal to 20 μm) of the high-density three-dimensional circuit board 100a.

Figure 3:
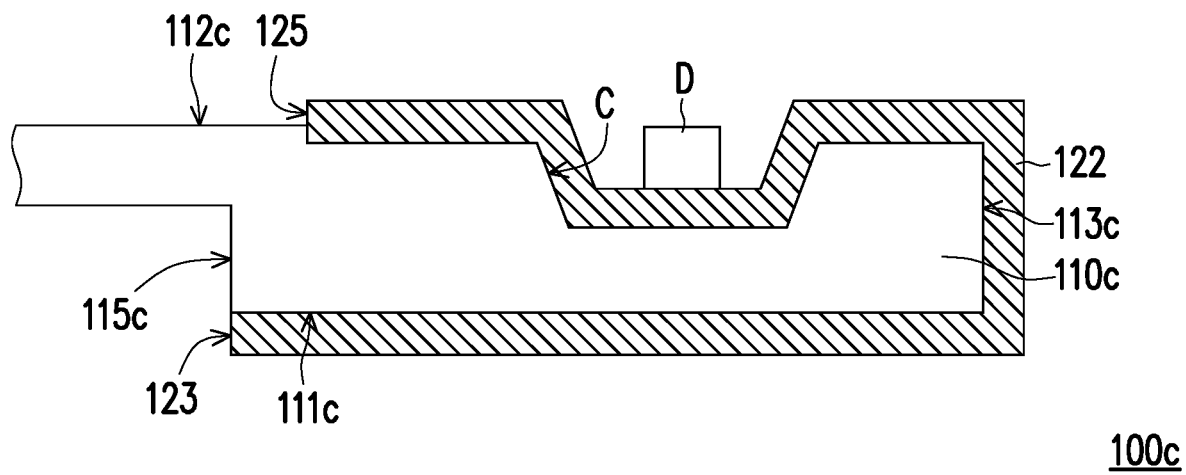
FIG. 3 is a schematic side view of a three-dimensional circuit board according to another embodiment of the disclosure.

FIG. 3 is a schematic side view of a three-dimensional circuit board according to another embodiment of the disclosure. Please refer to FIG. 1C and FIG. 3 at the same time. A three-dimensional circuit board 100c of the embodiment is similar to the three-dimensional circuit board 100a of FIG. 1C, but it should be noted that in the embodiment, the three-dimensional circuit board 100c further includes an electronic element D, and at least one of a first plane 111c, a second plane 112c, and a first side surface 113c connecting the first plane 111c and the second plane 112c of a ceramic substrate 110c has an accommodating groove C, wherein the electronic element D is disposed in the accommodating groove C. As shown in FIG. 3, in the embodiment, the second plane 112c has the accommodating groove C, and the electronic element D is disposed on the second plane 112c and is electrically connected to the circuit 122 located in the accommodating groove C. The electronic element D is, for example, an active element or a passive element. Since the three-dimensional circuit board 100c of the embodiment is provided with the electronic element D, signal down-conversion or processing may be performed, which can prevent loss or distortion of high-frequency signals due to long-distance transmission. In addition, a horizontal distance T between the first end 123 of the circuit 122 and the second side surface 115c of the ceramic substrate 110c of the embodiment is embodied as 0, that is, the first end 123 of the circuit 122 is aligned with the second side surface 115c of the ceramic substrate 110c.

Figure 4:
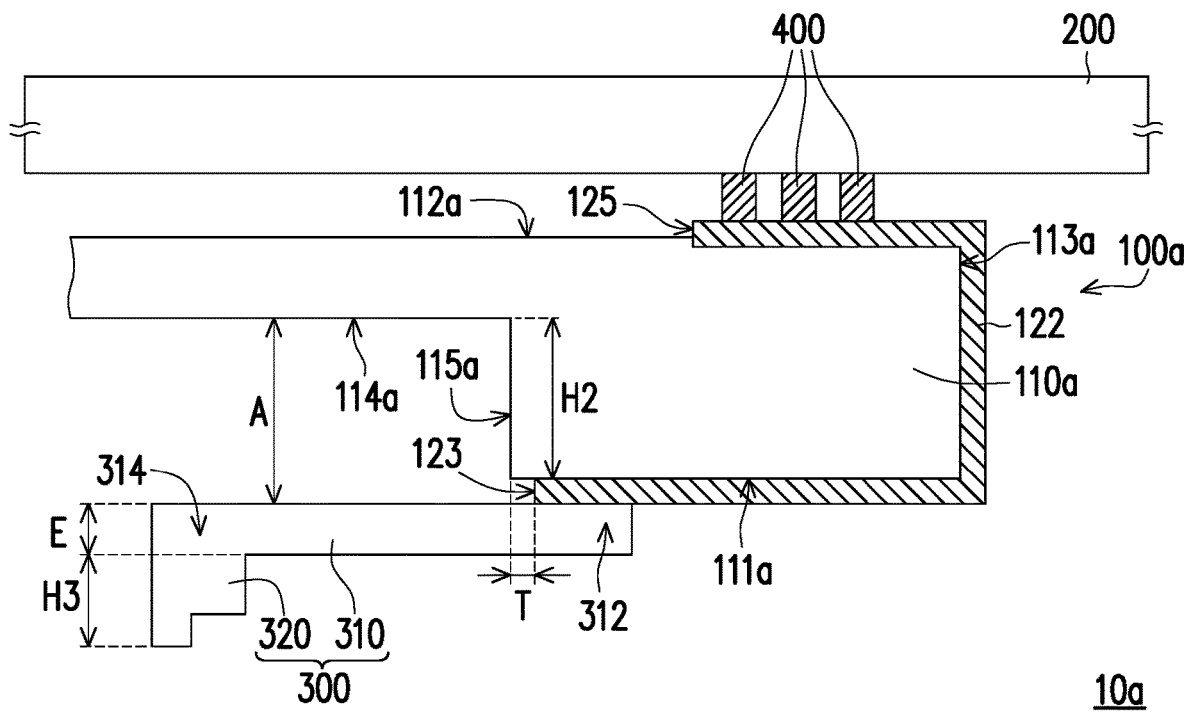
FIG. 4 is a schematic side view of a probe card according to an embodiment of the disclosure.

FIG. 4 is a schematic side view of a probe card according to an embodiment of the disclosure. Please refer to FIG. 4. In the embodiment, a probe card 10a includes the three-dimensional circuit board 100a, a printed circuit board 200, and a probe structure 300. The printed circuit board 200 is disposed on the second plane 112a of the three-dimensional circuit board 100a and is electrically connected to the circuit 122 through a connector 400. The connector 400 is, for example, solder, but not limited thereto. The probe structure 300 includes a cantilever 310 and a needle 320. The cantilever 310 has a rectangular cross-section and has a fixed end 312 and a free end 314. The fixed end 312 is disposed on the first plane 111a and is connected to the circuit 122. The needle 320 is connected to the free end 314, and there is an air gap A between the cantilever 310 and the third plane 114a.

Furthermore, as shown in FIG. 4, in the probe structure 300 on the first plane 111a, a large part of the cantilever 310 protrudes from the second side surface 115a and is suspended except for being connected to the circuit 122. In other words, since the groove 116a is designed in the three-dimensional circuit board 100a, the cantilever 310 of the probe structure 300 may directly contact the circuit 122 located on the first plane 111a without any metal pillar, which can effectively simplify the process of a probe card 10a. In an embodiment, the second height H2 of the second side surface 115a of the ceramic substrate 110a is greater than a thickness E of the cantilever 310 plus a third height H3 of the needle 320, that is, H2>E+H3, wherein the second height H2 is at least greater than 150 μm, and the third height H3 is at least less than 100 μm. Thereby, the assembly of the probe structure 300 and the three-dimensional circuit board 100a of the embodiment does not require any base, which can effectively simplify the process of the probe card 10a.

In short, since the second height H2 of the second side surface 115a of the ceramic substrate 110a of the embodiment is greater than the third height H3 of the needle 320 plus the thickness E of the cantilever 310, the probe structure 300 can be prevented from colliding with the three-dimensional circuit board 100a or the printed circuit board 200. In addition, since the circuits 122 are separately disposed on the first plane 111a, the first side surface 113a, and the second plane 112a of the ceramic substrate 110a, the ceramic substrate 110a can complete the circuit conduction of the upper and lower surfaces without any drilling process, and circuit extension may be performed to facilitate the connection with the printed circuit board 200.

Figure 5:
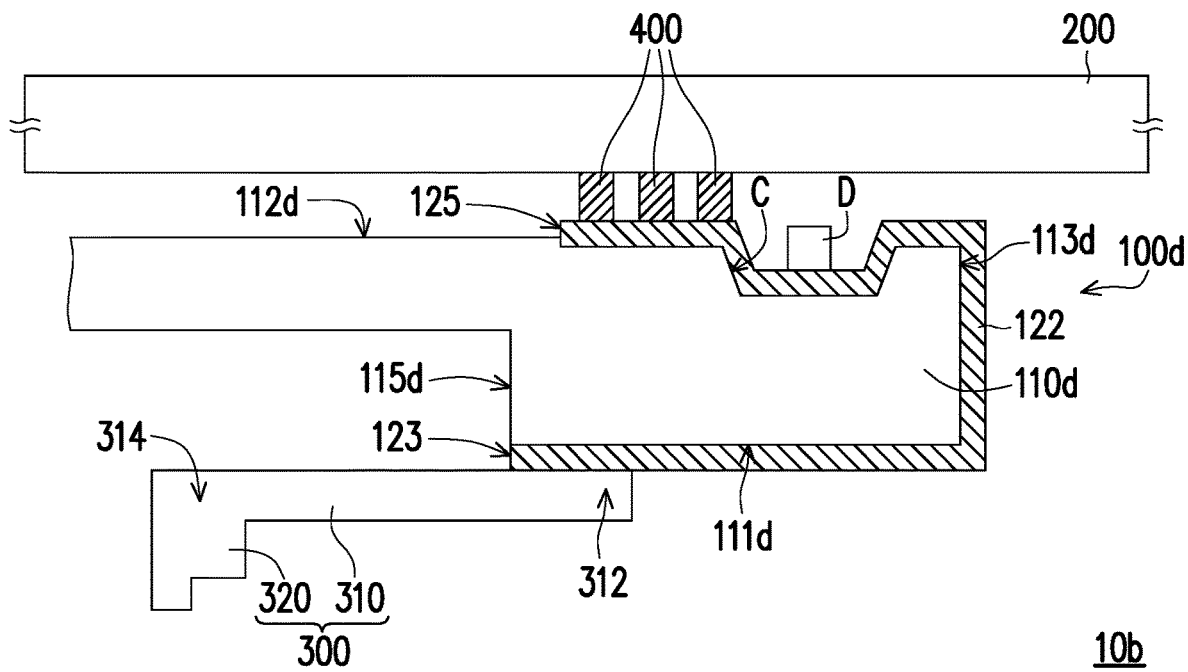
FIG. 5 is a schematic side view of a probe card according to another embodiment of the disclosure.

FIG. 5 is a schematic side view of a probe card according to another embodiment of the disclosure. Please refer to FIG. 4 and FIG. 5 at the same time. A probe card 10b of the embodiment is similar to the probe card 10a of FIG. 5, but it should be noted that in the embodiment, a three-dimensional circuit board 100d further includes an electronic element D, and at least one of a first plane 111d, a second plane 112d, and a first side surface 113d connecting the first plane 111d and the second plane 112d of a ceramic substrate 110d has an accommodating groove C, wherein the electronic element D is disposed in the accommodating groove C. Here, the second plane 112d has the accommodating groove C, and the electronic element D is disposed on the second plane 112d and is electrically connected to the circuit 122 located in the accommodating groove C. The electronic element D is, for example, an active element or a passive element. In addition, a horizontal distance T between the first end 123 of the circuit 122 and the second side surface 115d of the ceramic substrate 110d of the embodiment is embodied as 0, that is, the first end 123 of the circuit 122 is aligned with the second side surface 115d of the ceramic substrate 110d.

In short, with the requirements of high-frequency circuits or high-speed operational circuits, when a signal is transmitted from an IC end to the probe card 10b, signal down-conversion or processing must be performed in a short distance. Therefore, the electronic element D (for example, the active element or the passive element) may be adhered to the accommodating groove C on the second plane 112d (or the first plane 111d or the first side surface 113d) of the three-dimensional circuit board 100d, so that signal down-conversion or processing can be performed in the shortest distance, so as to prevent loss or distortion of high-frequency signals due to long-distance transmission.

In summary, in the design of the three-dimensional circuit board of the disclosure, the circuits are separately disposed on the first plane, the first side surface, and the second plane of the ceramic substrate, and the ceramic substrate has the second side surface opposite to the first side surface and with a height lower than the first side surface. In this way, the ceramic substrate can complete the circuit conduction of the upper and lower surfaces without any drilling process. Furthermore, when the probe structure is subsequently disposed on the three-dimensional circuit board to form the probe card, the configuration of the second side surface can prevent the probe structure from colliding with the three-dimensional circuit board or the printed circuit board during the test process, so that the probe card of the disclosure can have good test stability. In addition, in the manufacturing method of the three-dimensional circuit board of the disclosure, the trace metal is generated through lasering the ceramic substrate to serve as the electroplating seed layer of the subsequent electroplating process, so as to form the circuits separated from each other. Therefore, the three-dimensional circuit board and the manufacturing method thereof of the disclosure have the advantages of simple manufacturing and low cost, and the circuits are separated from each other without interlacing to effectively prevent cross talk.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A three-dimensional circuit board, comprising:
   a ceramic substrate, having a first plane, a second plane, a third plane located between the first plane and the second plane, a first side surface connecting the first plane and the second plane, and a second side surface connecting the first plane and the third plane and opposite to the first side surface, wherein a first height of the first side surface is greater than a second height of the second side surface, and the third plane and the second side surface form a groove; and
   a plurality of circuits, separately embedded on the first plane of the ceramic substrate and extending along the first side surface to be embedded on the second plane, wherein an arrangement density of the circuits on the first plane is greater than an arrangement density on the second plane.

2. The three-dimensional circuit board according to claim 1, wherein each of the plurality of the circuits has a first end and a second end, the first end is located on the first plane, the second end is located on the second plane, there is a horizontal distance between the first end and the second side surface, and the horizontal distance is equal to 0 or less than 100 μm.

3. The three-dimensional circuit board according to claim 1, wherein the second height is at least greater than 150 μm.

4. The three-dimensional circuit board according to claim 1, wherein a line width of each of the plurality of the circuits is between 10 μm and 65 μm.

5. The three-dimensional circuit board according to claim 1, wherein the ceramic substrate comprises 0.1 wt % to 5 wt % of yttrium element.

6. The three-dimensional circuit board according to claim 1, further comprising:
   an electronic element, wherein at least one of the first plane, the second plane, and the first side surface of the ceramic substrate has an accommodating groove, and the electronic element is disposed in the accommodating groove.

7. A probe card, comprising:
   a three-dimensional circuit board, comprising:
   a ceramic substrate, having a first plane, a second plane, a third plane located between the first plane and the second plane, a first side surface connecting the first plane and the second plane, and a second side surface connecting the first plane and the third plane and opposite to the first side surface, wherein a first height of the first side surface is greater than a second height of the second side surface, and the third plane and the second side surface form a groove; and
   a plurality of circuits, separately embedded on the first plane of the ceramic substrate and extending along the first side surface to be embedded on the second plane, wherein an arrangement density of the circuits on the first plane is greater than an arrangement density on the second plane;
   a printed circuit board, disposed on the second plane of the three-dimensional circuit board and electrically connected to the plurality of the circuits; and
   a probe structure, comprising a cantilever and a needle, wherein the cantilever has a fixed end and a free end, the fixed end is disposed on the first plane and is connected to the circuits, the needle is connected to the free end, and there is an air gap between the cantilever and the third plane.

8. The probe card according to claim 7, wherein the second height of the second side surface of the ceramic substrate is greater than a thickness of the cantilever plus a third height of the needle.

9. The probe card according to claim 8, wherein the third height is at least less than 100 μm.

10. The probe card according to claim 7, wherein each of the plurality of the circuits has a first end and a second end, the first end is located on the first plane, the second end is located on the second plane, there is a horizontal distance between the first end and the second side surface, and the horizontal distance is equal to 0 or less than 100 μm.

11. The probe card according to claim 7, wherein the second height is at least greater than 150 μm.

12. The probe card according to claim 7, wherein a line width of each of the plurality of the circuits is between 10 μm and 65 μm.

13. The probe card according to claim 7, wherein the ceramic substrate comprises 0.1 wt % to 5 wt % of yttrium element.

14. The probe card according to claim 7, wherein the three-dimensional circuit board further comprises:
    an electronic element, wherein at least one of the first plane, the second plane, and the first side surface of the ceramic substrate has an accommodating groove, and the electronic element is disposed in the accommodating groove.

\* \* \* \* \*